United States Patent
Yogo et al.

(10) Patent No.: US 9,309,983 B2
(45) Date of Patent: Apr. 12, 2016

(54) FLUID CONTROL APPARATUS JOINT, AND FLUID CONTROL APPARATUS

(71) Applicant: FUJIKIN INCORPORATED, Osaka-shi (JP)

(72) Inventors: Ryuji Yogo, Osaka (JP); Takahiro Matsuda, Osaka (JP); Izuru Shikata, Osaka (JP); Shinya Nojima, Osaka (JP)

(73) Assignee: FUJIKIN INCORPORATED, Osaka-shi (JP)

( * ) Notice: Subject to any disclaimer, the term of this patent is extended or adjusted under 35 U.S.C. 154(b) by 111 days.

(21) Appl. No.: 14/310,253

(22) Filed: Jun. 20, 2014

(65) Prior Publication Data
US 2015/0000773 A1    Jan. 1, 2015

(30) Foreign Application Priority Data

Jun. 27, 2013   (JP) .................................. 2013-134447

(51) Int. Cl.
| | |
|---|---|
| F16K 27/00 | (2006.01) |
| F16L 39/06 | (2006.01) |
| F16L 41/03 | (2006.01) |
| C23C 16/455 | (2006.01) |

(52) U.S. Cl.
CPC ............... *F16K 27/003* (2013.01); *F16L 39/06* (2013.01); *F16L 41/03* (2013.01); *C23C 16/45561* (2013.01); *Y10T 137/87684* (2015.04)

(58) Field of Classification Search
USPC ......................................................... 137/884
See application file for complete search history.

(56) References Cited

U.S. PATENT DOCUMENTS

| | | | | |
|---|---|---|---|---|
| 5,983,933 | A * | 11/1999 | Ohmi .................. | F15B 13/0817 137/597 |
| 6,152,175 | A * | 11/2000 | Itoh ....................... | F16K 27/003 137/602 |
| 7,152,629 | B2 * | 12/2006 | Tokuda .................. | F16K 27/003 137/884 |
| 7,841,628 | B2 * | 11/2010 | Tokuda ................... | F16L 39/00 137/884 |
| 8,281,816 | B2 * | 10/2012 | Nakata .................. | F16K 27/003 137/884 |
| 9,169,940 | B2 * | 10/2015 | Yogo ..................... | F16K 27/003 |
| 2002/0185185 | A1 | 12/2002 | Yamaji et al. | |

FOREIGN PATENT DOCUMENTS

JP    2002-349797 A    12/2002

* cited by examiner

*Primary Examiner* — John Fox
(74) *Attorney, Agent, or Firm* — Locke Lord LLP (57) ABSTRACT

A fluid draw-off block joint includes an inlet channel, an outlet channel, and a closure portion. The inlet channel has a first end communicating with an outlet channel of a single-line block joint, and a second end communicating with an inlet channel of an outlet on-off valve. The outlet channel has a first end communicating with an outlet channel of the outlet on-off valve, and a second end being open through a side surface in a line exit direction. The closure portion closes an opening of a bifurcated channel of a plural-line block joint.

6 Claims, 5 Drawing Sheets

FLUID CONTROL APPARATUS JOINT, AND FLUID CONTROL APPARATUS

BACKGROUND OF THE INVENTION

1. Field of the Invention

The present invention relates to a fluid control apparatus joint and a fluid control apparatus, and more particularly to a joint suitable for use in a fluid control apparatus termed "integrated fluid control apparatus," and a fluid control apparatus having the joint.

2. Description of the Related Art

Fluid control apparatuses used in semiconductor manufacturing apparatuses have been increasingly integrated. Such an integrated fluid control apparatus includes a plurality of lines arranged in parallel, with inlets of all the lines being oriented in one direction and outlets of all the lines being oriented in the other direction, and each of the lines has a plurality of fluid control devices arranged on an upper stage and a plurality of block joint members arranged on a lower stage, thereby eliminating the need for providing a pipe or a pipe joint (see, for example, JP-A-2002-349797).

Figure 5:
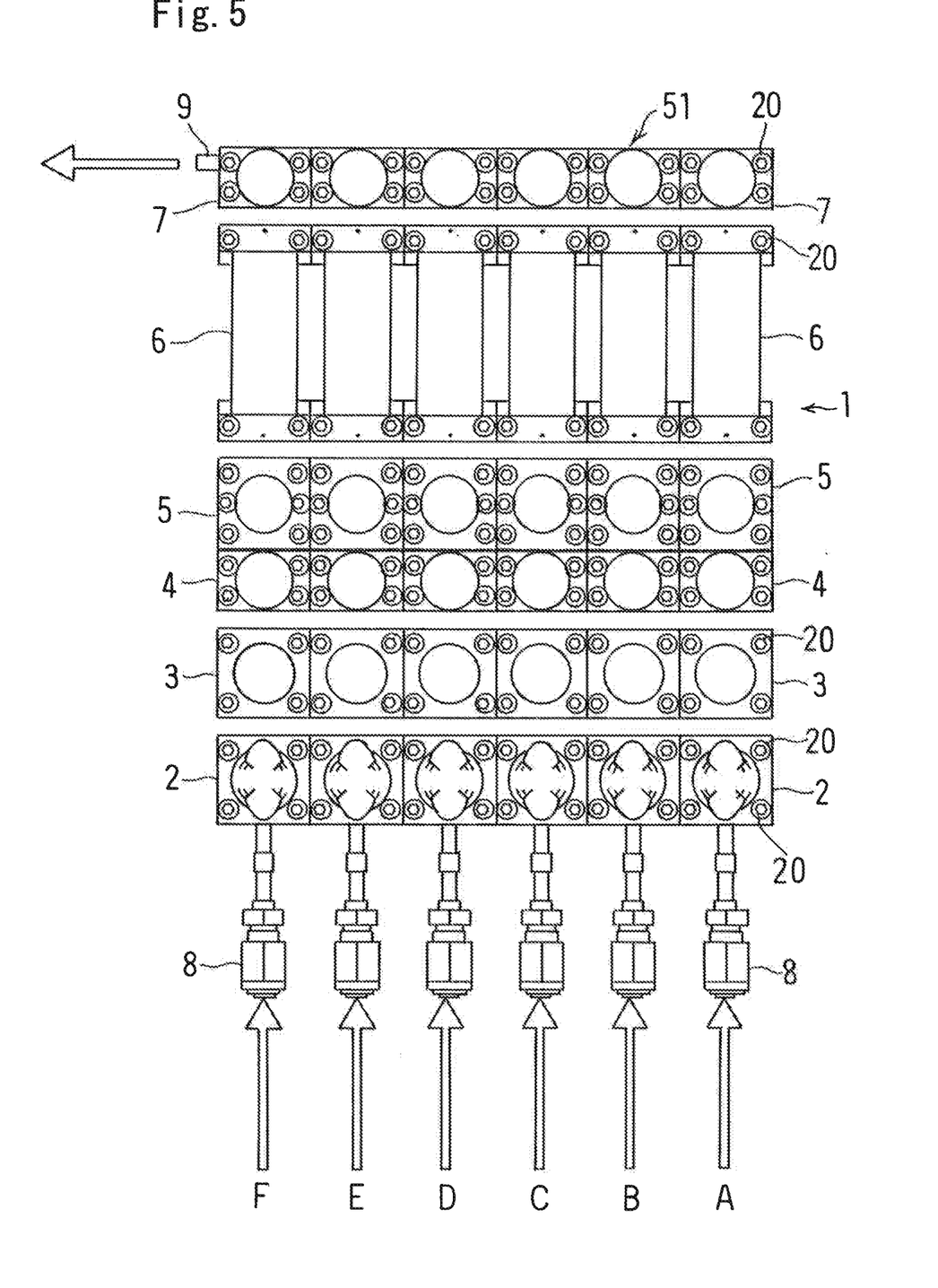
FIG. 5 is a plan view illustrating an example of the fluid control apparatus being studied.

FIG. 5 illustrates an example of such an integrated fluid control apparatus. A fluid control apparatus (1) includes a plurality of (six in FIG. 5) lines (A), (B), (C), (D), (E), (F). Each of the lines includes, as a plurality of fluid control devices (2), (3), (4), (5), (6), (7) arranged on the upper stage, a manual valve (2), a filter (3), a two-port inlet on-off valve (4), a three-port inlet on-off valve (5), a mass flow controller (flow rate controller) (6), and an outlet on-off valve (7). Each of the lines (A), (B), (C), (D), (E), (F) has an inlet pipe joint (8) on an inlet side thereof. On the outlet side, a fluid draw-off portion (9) common to all the lines (A), (B), (C), (D), (E), (F) is provided.

Each of the fluid control devices (2), (3), (4), (5), (6), (7) is upwardly removably mounted on each of the corresponding block joint members (not illustrated) by means of male-threaded members (20) fastened from above.

Figure 6:
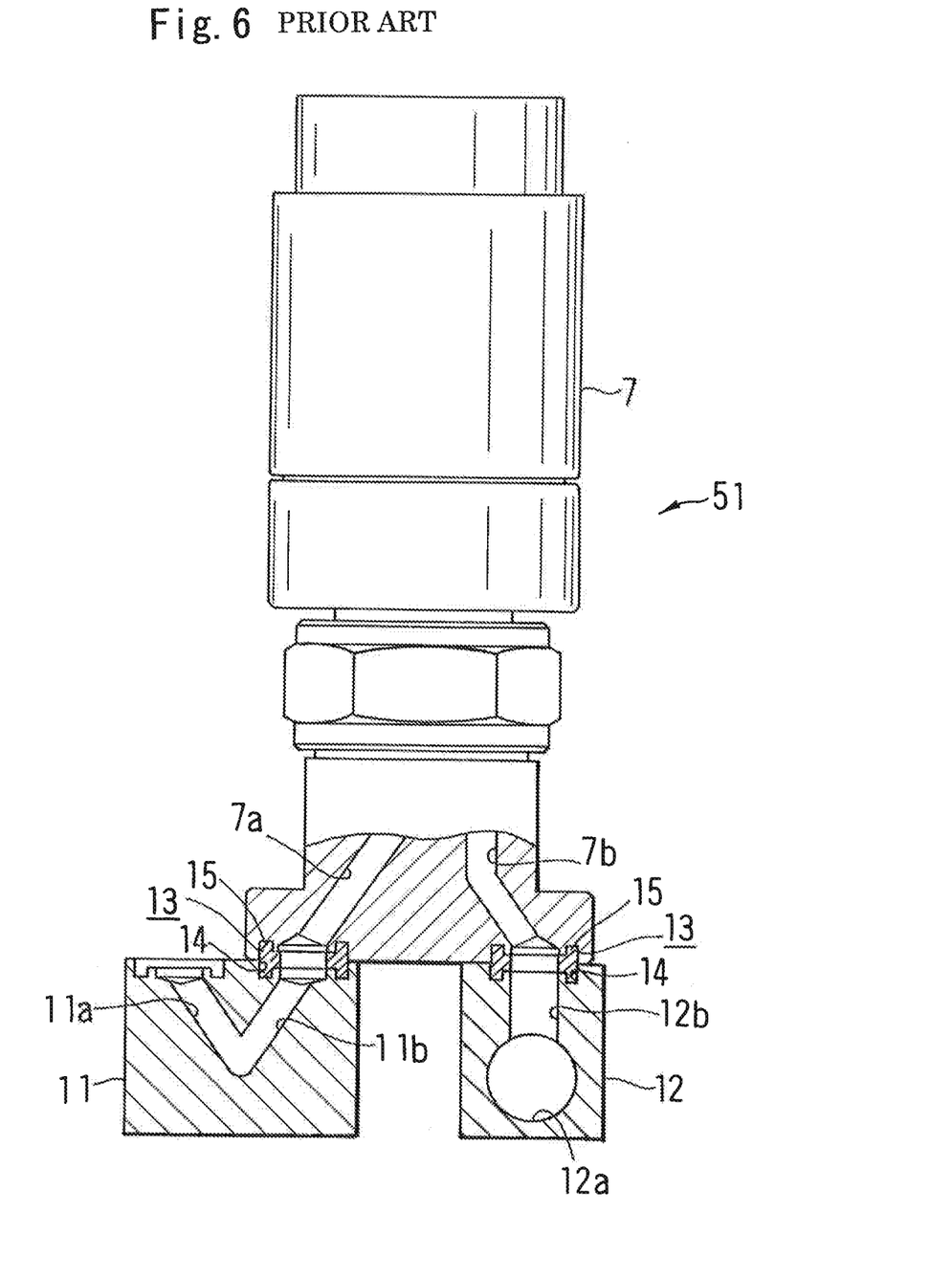
FIG. 6 is a partially cutaway side view illustrating the conventional fluid control apparatus corresponding to FIG. 1.

As illustrated in FIG. 6, the fluid control apparatus (1) includes an outlet on-off valve support structure (51) that has a single-line block joint (11) provided for each of the lines (A), (B), (C), (D), (E), (F), and an plural-line block joint (12) common to and disposed over all the of lines (A), (B), (C), (D), (E), (F), both of which serve as joint members (11), (12) supporting each of the outlet on-off valves (7).

The outlet on-off valve (7) has an inlet channel (7a) and an outlet channel (7b), both of which are open through a lower surface of the outlet on-off valve (7).

The single-line block joint (11) has an inlet channel (11a) and an outlet channel (11b) both being open through the upper surface of the single-line block joint (11), which constitute a V-shaped channel (11a), (11b). The outlet channel (11b) communicates with the inlet channel (7a) of the outlet on-off valve (7). Although not illustrated, the inlet channel (11a) communicates with an outlet channel of the mass flow controller (6).

The plural-line block joint (12) has a fluid draw-off channel (12a) extending in a direction orthogonal to the lines (A), (B), (C), (D), (E), (F), and a plurality of bifurcated channels (12b) being open through the upper surface of the plural-line block joint (12). The number of the bifurcated channels (12b) provided is the same as that of the lines (A), (B), (C), (D), (E), (F). The bifurcated channel (12b) extends upward from the fluid draw-off channel (12a), and communicates with the outlet channel (7b) of the outlet on-off valve (7).

The outlet channel (11b) of the single-line block joint (11) butts against the inlet channel (7a) of the outlet on-off valve (7) via a seal portion (13). The outlet channel (7b) of the outlet on-off valve (7) butts against the bifurcated channel (12b) of the plural-line block joint (12) via a seal portion (13). The seal portion (13) is formed by providing an annular seal member (15) in an annular recess (14) formed by butting opposed recesses provided on both of the butted-against surfaces against each other.

In this fluid control apparatus (1), one or more among all the lines (A), (B), (C), (D), (E), (F) are chosen, where the manual valve (2) and the inlet on-off valves (4), (5) are made open, whereby required fluids are supplied. In an outlet on-off valve support structure (51) as illustrated in FIG. 6, the outlet on-off valve (7) is made open, where each fluid having passed through each of selected lines (for example, lines (A), (B), (D)) flows, from the outlet channel (7b) of the outlet on-off valve (7) of each line, through the bifurcated channel (12b) of the plural-line block joint (12), into the fluid draw-off channel (12a), and then the fluid is drawn off from the fluid draw-off portion (9) provided at an end portion of the plural-line block joint (12).

Therefore, in accordance with the fluid control apparatus (1), depending on which line(s) among all the lines (A), (B), (C), (D), (E), (F) is/are chosen and by appropriately changing the fluid(s) to be passed therethrough, various fluids coming from the mass flow controllers (6), where the flow rates thereof are adjusted, are mixed in the fluid draw-off channel (12a) of the plural-line block joint (12) and then drawn off from the fluid draw-off portion (9).

SUMMARY OF THE INVENTION

According to the conventional fluid control apparatus (1) described above, mixing of various fluids and drawing off of the mixed fluid from the fluid draw-off portion (9) is possible, whereas individual drawing off of the fluid from an optional line only is impossible, which has caused a problem that the degree of flexibility in drawing off of the fluid is insufficient.

An object of the present invention is to provide a fluid control apparatus joint, which improves flexibility of the fluid draw-off from a plurality of lines, and the fluid control apparatus including the joint.

The fluid control apparatus joint in accordance with the present invention is a fluid control apparatus joint, the fluid control apparatus including a plurality of lines arranged in parallel, with inlets of all the lines being oriented in a same direction and outlets of all the lines being oriented in a same direction, each of the lines having a plurality of fluid control devices arranged on an upper stage and a plurality of joint members arranged on a lower stage, each of the lines including an outlet on-off valve as one of the fluid control devices, and a single-line block joint and an plural-line block joint both as the joint members supporting the outlet on-off valve, the outlet on-off valve having an inlet channel and an outlet channel both being open through a lower surface of the outlet on-off valve, the single-line block joint having an inlet channel and an outlet channel both being open through an upper surface of the single-line block joint, and each of the single-line block joints being provided for each line, the plural-line block joint, in the fluid control apparatus as a whole, having: a fluid draw-off channel extending in a direction orthogonal to the lines; and a plurality of bifurcated channels being open through an upper surface of the plural-line block joint, and the plural-line block joint being common to the plurality of lines, the fluid control apparatus joint, being block-shaped, and being disposed such that an upper surface of the fluid control apparatus joint butts against the lower surface of the outlet on-off valve, and a lower surface of the fluid control apparatus joint contacts the upper surface of the single-line block joint and the upper surface of the plural-line block joint, the fluid control apparatus joint including: an inlet channel having a first end being open through the lower surface of the fluid control apparatus joint and communicating with the outlet channel of the single-line block joint, and a second end being open through the upper surface of the fluid control apparatus joint and communicating with the inlet channel of the outlet on-off valve; an outlet channel having a first end being open through the upper surface of the fluid control apparatus joint and communicating with the outlet channel of the outlet on-off valve, and a second end being open in a line exit direction; and a closure portion closing an opening of the bifurcated channel of the plural-line block joint.

In the conventional fluid control apparatus, throughout all the plurality of lines, a fluid introduced into each of the lines passes through the fluid draw-off channel of the plural-line block joint and then is drawn off from the fluid draw-off portion provided at the end portion of the plural-line block joint.

The use of the fluid control apparatus joint in accordance with the present invention, enables the fluid to be drawn-off without passing through the fluid draw-off channel of the plural-line block joint in the line employing the fluid control apparatus joint. As for the lines that do not employ this fluid control apparatus joint, fluid is drawn off from the fluid draw-off portion through the fluid draw-off channel of the plural-line block joint that serves as a common channel. Thus, in the fluid control apparatus where the fluid control apparatus joint in accordance with the present invention is provided, in addition to the function of drawing off of the fluid from the fluid draw-off portion, which is a function conventional fluid control apparatuses have, individual drawing off of the fluid from each of the lines where the fluid control apparatus joint in accordance with the present invention is provided is possible. This configuration increases flexibility in drawing-off fluids from a plurality of lines.

The fluid control apparatus in accordance with the present invention is a fluid control apparatus including a plurality of lines arranged in parallel, with inlets of all the lines being oriented in a same direction and outlets of all the lines being oriented in a same direction, each of the lines having a plurality of fluid control devices arranged on an upper stage and a plurality of joint members arranged on a lower stage, each of the lines including an outlet on-off valve as one of the fluid control devices, and a single-line block joint and an plural-line block joint both as the joint members supporting the outlet on-off valve, the outlet on-off valve having an inlet channel and an outlet channel both being open through a lower surface of the outlet on-off valve, the single-line block joint having an inlet channel and an outlet channel both being open through an upper surface of the single-line block joint, and each of the single-line block joints being provided for each line, the plural-line block joint, in the fluid control apparatus as a whole, having: a fluid draw-off channel extending in a direction orthogonal to the lines; and a plurality of bifurcated channels being open through an upper surface of the plural-line block joint, and the plural-line block joint being common to the plurality of lines, the fluid control apparatus further including a fluid control apparatus joint being block-shaped, and being disposed such that an upper surface of the fluid control apparatus joint butts against the lower surface of the outlet on-off valve, and a lower surface of the fluid control apparatus joint contacts the upper surface of the single-line block joint and the upper surface of the plural-line block joint, the fluid control apparatus joint including: an inlet channel having a first end being open through the lower surface of the fluid control apparatus joint and communicating with the outlet channel of the single-line block joint, and a second end being open through the upper surface of the fluid control apparatus joint and communicating with the inlet channel of the outlet on-off valve; an outlet channel having a first end being open through the upper surface of the fluid control apparatus joint and communicating with the outlet channel of the outlet on-off valve, and a second end being open in a line exit direction; and a closure portion closing an opening of the bifurcated channel of the plural-line block joint.

The fluid control apparatus of the present invention enables not only the drawing off of the fluid from the fluid draw-off portion, which is a function conventional fluid control apparatuses have, but also the individual drawing off of the fluid from the line where the fluid control apparatus joint in accordance with the present invention is provided. This configuration increases flexibility in drawing-off fluids from a plurality of lines.

In the above-mentioned fluid control apparatus joint (block joint), the outlet channel thereof may have a first end that is open through the upper surface of the fluid control apparatus joint and communicates with the outlet channel of the outlet on-off valve, and a second end that is open through a side surface of the fluid control apparatus joint. In addition, in the above-mentioned fluid control apparatus joint (block joint), the outlet channel thereof may have a first end that is open through the upper surface of the fluid control apparatus joint and communicates with the outlet channel of the outlet on-off valve, and a second end that is open through the upper surface of the fluid control apparatus joint, with the first end being flush with the second end.

Figure 1:
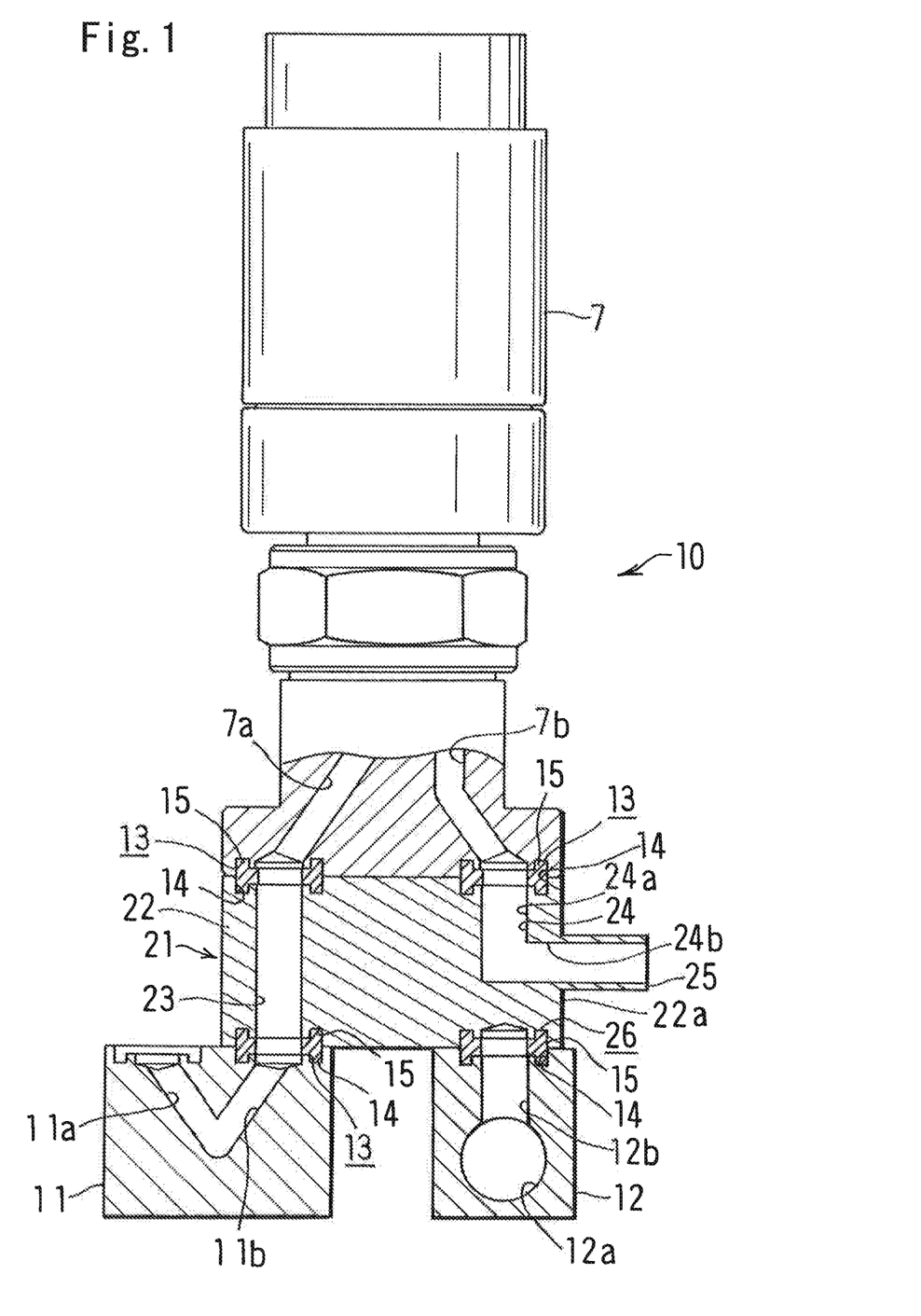
FIG. 1 is a partially cutaway side view illustrating a first embodiment of a fluid control apparatus and a fluid control apparatus joint in accordance with the present invention.

In this specification, the terms "upper" and "lower" correspond to "upper" and "lower" sides of FIG. 1, respectively. However, these terms are used only for convenience, and the fluid control apparatus of the present invention may be used either horizontally or vertically.

The present invention makes it possible to separately draw off the fluid from an optional line only, which results in the improved flexibility of the fluid draw-off from a plurality of lines.

DESCRIPTION OF THE EMBODIMENTS

The embodiments of the present invention will now be described with reference to the accompanying drawings.

Figure 2:
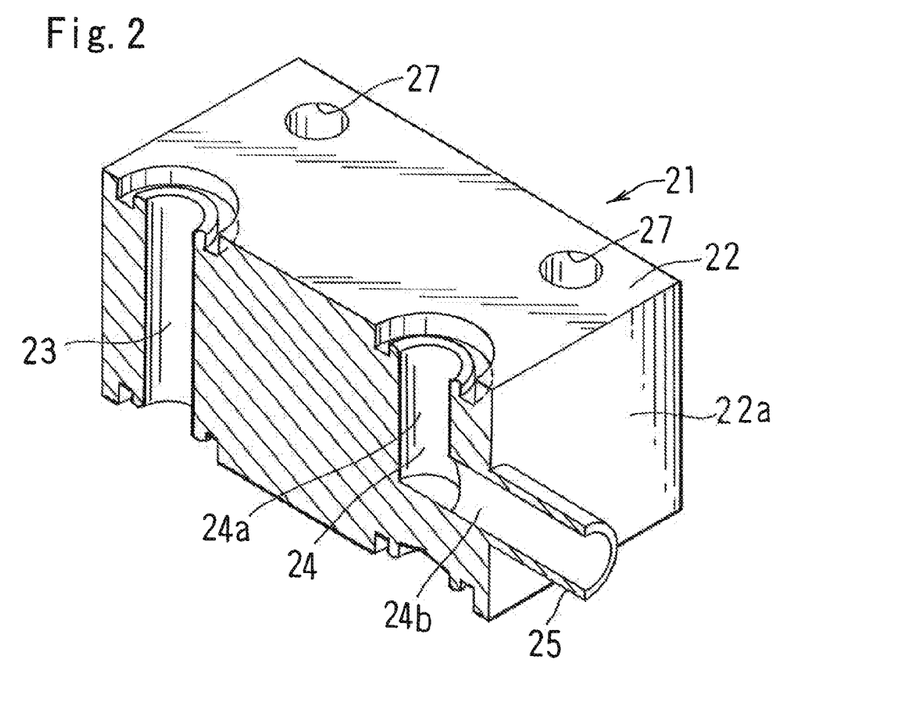
FIG. 2 is a partially cutaway perspective view illustrating the fluid control apparatus joint in FIG. 1.

FIG. 1 illustrates the first embodiment of the fluid control apparatus joint and the fluid control apparatus of the present invention. FIG. 2 illustrates the first embodiment of the fluid control apparatus joint of the present invention.

The fluid control apparatus of the present invention relates to an improvement to an outlet on-off valve support structure (51) in the fluid control apparatus (1) including a plurality of lines (A), (B), (C), (D), (E), (F) as illustrated in FIGS. 5 and 6. An outlet on-off valve support structure (10) in the fluid control apparatus of the present invention includes an outlet on-off valve (7) as one of the fluid control devices arranged on an upper stage for each line, a single-line block joint (11) as one of the joint members arranged on a lower stage for each line, an plural-line block joint (12) as a joint member arranged over all the lines, and a fluid draw-off block joint (the fluid control apparatus block-joint) (21) in accordance with the present invention arranged between the outlet on-off valve (7), and the single-line block joint (11) and the plural-line block joint (12).

The outlet on-off valve support structure (10) illustrated in FIG. 1 is used in combination with the outlet on-off valve support structure (51) in FIG. 6. For example, among the six lines (A), (B), (C), (D), (E), (F) in FIG. 5, each of the five lines includes the outlet on-off valve support structure (51) illustrated in FIG. 6, and the remaining one line includes the outlet on-off valve support structure (10) illustrated in FIG. 1.

The outlet on-off valve (7), the single-line block joint (11), and the plural-line block joint (12) used in the outlet on-off valve support structure (10) illustrated in FIG. 1 are the same as those used in the outlet on-off valve support structure (51) of the conventional fluid control apparatus (1).

That is, the outlet on-off valve (7) has an inlet channel (7*a*) and an outlet channel (7*b*) both being open through a lower surface thereof. The single-line block joint (11) has an inlet channel (11*a*) and an outlet channel (11*b*) both being open through an upper surface thereof to constitute a V-shaped channel (11*a*), (11*b*). Although not illustrated, the inlet channel (11*a*) of the single-line block joint (11) communicates with an outlet channel of a mass flow controller (6). The plural-line block joint (12) has a fluid draw-off channel (12*a*) extending in a direction orthogonal to the lines (A), (B), (C), (D), (E), (F), and a plurality of bifurcated channels (12*b*) being open through the upper surface of the plural-line block joint (12). The number of bifurcated channels (12*b*) provided is the same as that of the lines (A), (B), (C), (D), (E), (F).

As illustrated in FIGS. 1 and 2, the fluid draw-off block joint (21) as well as the single-line block joint (11) and the plural-line block joint (12) are block-shaped, and the fluid draw-off block joint (21) has a block body (22), and an inlet channel (23) and an outlet channel (24) provided in the block body (22).

The block body (22) has the same size as the body portion of the outlet on-off valve (7) as viewed from the above. The upper surface of the block body (22) butts against the lower surface of the outlet on-off valve (7), and the lower surface of the block body (22) contacts the upper surface of the single-line block joint (11) and the upper surface of the plural-line block joint (12).

The inlet channel (23) extends vertically. The lower end of the inlet channel (23) is open through the lower surface of the block body (22), and communicates with the upper end of the outlet channel (11*b*) of the single-line block joint (11). The upper end of the inlet channel (23) is open through the upper surface of the block body (22), and communicates with the lower end of the inlet channel (7*a*) of the outlet on-off valve (7).

The outlet channel (24) includes a vertical portion (24*a*) and a horizontal portion (24*b*). The vertical portion (24*a*) has an upper end that is open through the upper surface of the block body (22) and communicates with the lower end of the outlet channel (7*b*) of the outlet on-off valve (7). The vertical portion (24*a*) extends, from the upper surface of the block body (22), vertically halfway. The horizontal portion (24*b*) communicates with the lower end of the vertical portion (24*a*), extends in a direction orthogonal to the vertical portion (24*a*), and is open through a side surface (22*a*) of the block body (22) in the line exit direction. The side surface (22*a*) of the block body (22) located in the line exit direction is provided with a cylindrical connection portion (25) that communicates with the horizontal portion (24*b*), extends in the line direction, and enables connection to an external member.

With the outlet channel (24) and the cylindrical connection portion (25), the outlet channel (7*b*) of the outlet on-off valve (7) is connectable to any external member without communicating with the bifurcated channel (12*b*) of the plural-line block joint (12).

The outlet channel (11*b*) of the single-line block joint (11) butts against the inlet channel (23) of the fluid draw-off block joint (21) via a seal portion (13). The inlet channel (23) of the fluid draw-off block joint (21) also butts against the inlet channel (7*a*) of the outlet on-off valve (7) via a seal portion (13). The outlet channel (7*b*) of the outlet on-off valve (7) also butts against the outlet channel (24) of the fluid draw-off block joint (21) via a seal portion (13). The seal portion (13) is formed by providing an annular seal member (15) in an annular recess (14) formed by butting against opposed recesses, provided on both butted-against surfaces, against each other.

In FIG. 1, although it is preferable that the bifurcated channel (12*b*) of the plural-line block joint (12) is closed, the plural-line block joint (12) used is the same as that used in the outlet on-off valve support structure (51) as illustrated in FIG. 6. That is, the bifurcated channel (12*b*) of the plural-line block joint (12) does not correspond to the structure of the fluid draw-off block joint (21), and is not closed. Specifically stated, the bifurcated channel (12*b*) of the plural-line block joint (12) is designed to be capable of drawing off the fluid that has passed through the outlet channel (7*b*) of the outlet on-off valve (7). Therefore, in the outlet on-off valve support structure (10) including the fluid draw-off block joint (21), there exists a risk that the fluid may leak out from the upper end of the bifurcated channel (12*b*) of the plural-line block joint (12). To eliminate the risk, the block body (22) is provided on its lower surface with a closure portion (26) closing the opening of the bifurcated channel (12*b*) of the plural-line block joint (12).

The closure portion (26) has the same configuration as the seal portion (13). The closure portion (26) is formed by providing an annular seal member (15) in an annular recess (14) defined by a recess on the lower surface of the block body (22) and a recess on the upper surface of the plural-line block joint (12).

As illustrated in FIG. 2, the block body (22) is provided with through-bores (27) into which male-threaded members (20) are inserted in order to attach the outlet on-off valve (7) to the single-line block joint (11) and the plural-line block joint (12). The fluid draw-off block joint (21) is upwardly removably mounted on the corresponding single-line block joint (11) and the plural-line block joint (12), as lower stage block joint members, by means of the male-threaded members (20).

The outlet on-off valve support structure (10) illustrated in FIG. 1 may be used for any of the six lines (A), (B), (C), (D), (E), (F) illustrated in FIG. 5.

As described above, in the outlet on-off valve support structure (10), fluids may be drawn off without passing through the fluid draw-off channel (12a) of the plural-line block joint (12). Therefore, the use of this outlet on-off valve support structure (10) in combination with the conventional outlet on-off valve support structure (51) enables not only the drawing off of the fluids from the fluid draw-off portion (9), which is a function the conventional fluid control apparatus has, but also the separate drawing off of the fluid from the optional line only. This configuration improves flexibility of the fluid draw-off from a plurality of lines.

In the case where the above-mentioned fluid draw-off block joint (21) is used in the existing fluid control apparatus, only the outlet on-off valve (7) is once removed upwardly from the existing fluid control apparatus for additional attachment of the fluid draw-off block joint (21). All the parts and components used in the existing fluid control apparatus may be used except for the male-threaded members. The male-threaded members used in the existing fluid control apparatus is replaced by the male-threaded members (20) each of which has a length greater than the existing one so as to correspond to the fluid draw-off block joint (21) and the once-removed outlet on-off valve (7). Thus, the fluid draw-off block joint (21) and the outlet on-off valve (7) are attached to the corresponding single-line block joint (11) and plural-line block joint (12) by means of the male-threaded members (20). With this configuration, there is no need for changing the plural-line block joint (12), a change or a replacement of which is troublesome because it is disposed over all the lines, whereby the fluid control apparatus that enables the individual draw-off of the fluid from any of the lines is obtained.

Figure 3:
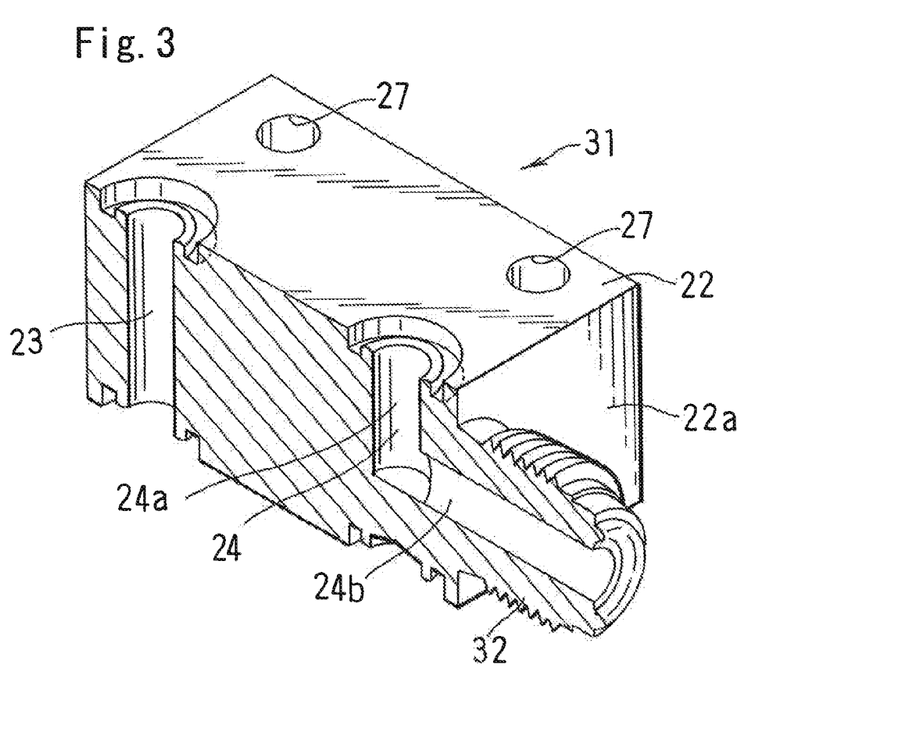
FIG. 3 is a partially cutaway perspective view illustrating a fluid control apparatus joint of a second embodiment of the fluid control apparatus and the fluid control apparatus joint in accordance with the present invention.

FIG. 3 illustrates the second embodiment of the fluid control apparatus joint and the fluid control apparatus of the present invention. As illustrated in FIG. 3, the fluid draw-off block joint (the fluid control apparatus block-joint) (31) of this embodiment has, as a connection portion (32) connecting the fluid draw-off block joint (31) to some external member, a pipe joint structure. Except for the connection portion (32), the fluid control apparatus and the fluid draw-off block joint (31) in FIG. 3 has the same configuration as the fluid control apparatus and the fluid draw-off block joint (21) in FIGS. 1 and 2. Therefore, the same elements are denoted by the same reference symbols and the description thereof will not be given.

The cylindrical connection portion (25) of the fluid draw-off block joint (21) illustrated in FIG. 2 is suitable for welding connection, whereas the fluid draw-off block joint (31) in FIG. 3 is suitable for pipe-joint connection. An appropriate choice between the fluid draw-off block joint (21) in FIG. 2 and the fluid draw-off block joint (31) in FIG. 3 leads to appropriate supply of the drawn-off fluid toward the outside.

Figure 4:
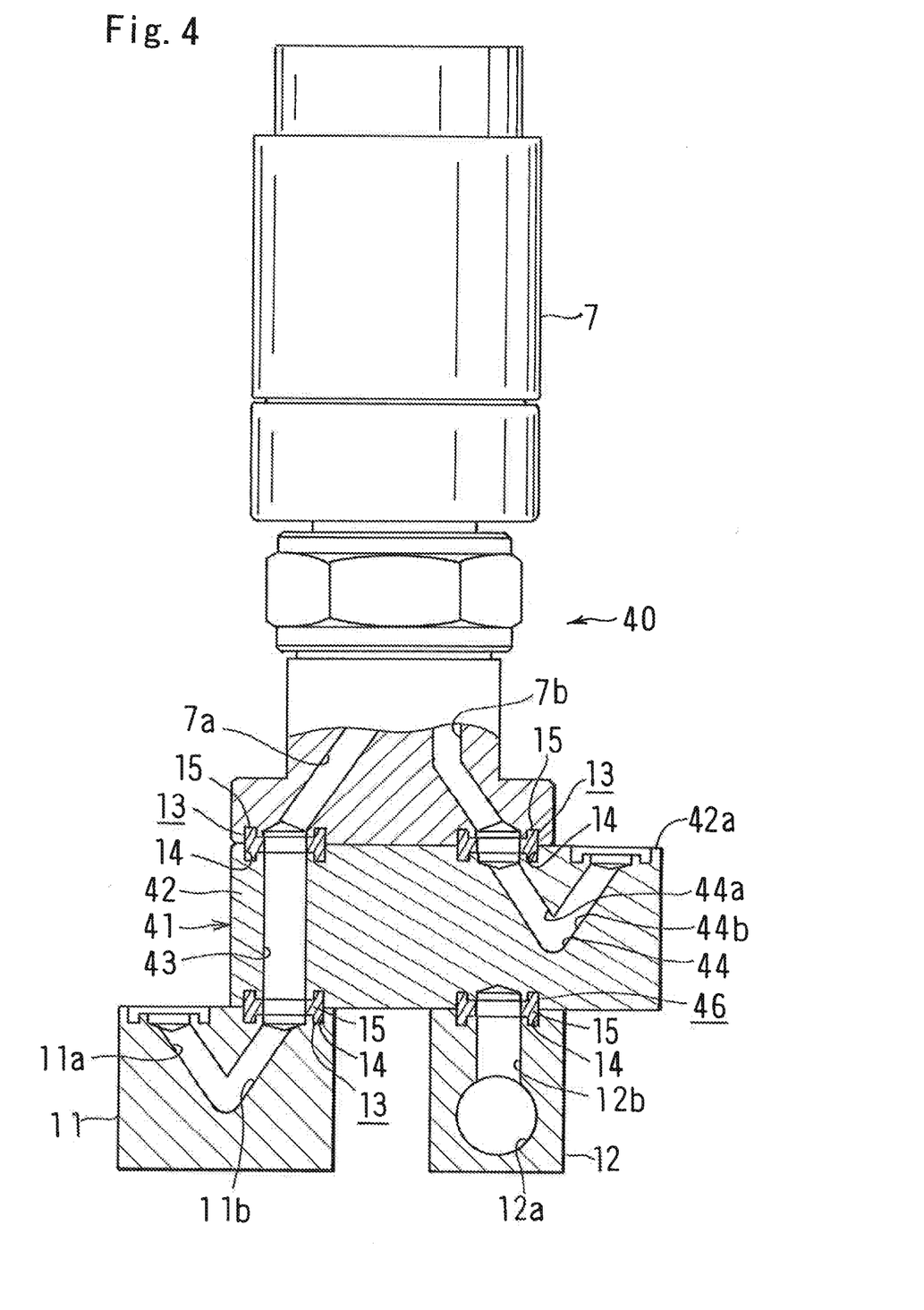
FIG. 4 is a partially cutaway side view illustrating a third embodiment of the fluid control apparatus and the fluid control apparatus joint in accordance with the present invention.

FIG. 4 illustrates the third embodiment of the fluid control apparatus joint and the fluid control apparatus of the present invention.

The outlet on-off valve support structure (40) of this embodiment, in which the fluid draw-off block joint (21) of the first embodiment is changed, includes an outlet on-off valve (7) as one of the fluid control devices arranged on an upper stage for each line, a single-line block joint (11) as one of the joint members arranged on a lower stage for each line, an plural-line block joint (12) as a joint member arranged over all the lines, and a fluid draw-off block joint (fluid control apparatus block joint) (41) in accordance with the present invention arranged between the outlet on-off valve (7), and the single-line block joint (11) and the plural-line block joint (12).

The configuration of the outlet on-off valve support structure (40) is the same as that of the outlet on-off valve support structure (10) illustrated in FIG. 1, except for the fluid draw-off block joint (41). The outlet on-off valve support structure (40) except for the fluid draw-off block joint (41) is used in the same manner as the outlet on-off valve support structure (10) illustrated in FIG. 1. That is, the outlet on-off valve support structure (40) illustrated in FIG. 4 is used in combination with the outlet on-off valve support structure (51) illustrated in FIG. 6. For example, among the six lines (A), (B), (C), (D), (E), (F) in FIG. 5, each of the five lines include the outlet on-off valve support structure (51) illustrated in FIG. 6, and the remaining one line includes the outlet on-off valve support structure (40) illustrated in FIG. 4.

The outlet on-off valve (7), the single-line block joint (11), and the plural-line block joint (12) of the outlet on-off valve support structure (40) have the same configuration as those described above. Therefore, the same elements are denoted by the same reference symbols and the description thereof will not be given.

The fluid draw-off block joint (41) as well as the single-line block joint (11) and the plural-line block joint (12) are block-shaped. The fluid draw-off block joint (41) has a block body (42), and an inlet channel (43) and an outlet channel (44) both provided in the block body (42).

The block body (42) is projecting from the body portion of the outlet on-off valve (7) toward the outlet side, as viewed from the above. The upper surface of the block body (42) butts against the lower surface of the outlet on-off valve (7), and the lower surface of the block body (42) contacts the upper surface of the single-line block joint (11) and the upper surface of the plural-line block joint (12).

The inlet channel (43) extends vertically. The lower end of the inlet channel (43) is open through the lower surface of the block body (42), and communicates with the upper end of the outlet channel (11b) of the single-line block joint (11). The upper end of the inlet channel (43) is open through the upper surface of the block body (42), and communicates with the lower end of the inlet channel (7a) of the outlet on-off valve (7).

The outlet channel (44) is V-shaped, and includes an on-off valve side half portion (44a) and a draw-off side half portion (44b). The on-off valve side half portion (44a) has an upper end that is open through the upper surface of the block body (42) and communicates with the lower end of the outlet channel (7b) of the outlet on-off valve (7). The on-off valve side half portion (44a) extends obliquely downward to a vertically halfway point of the block body (42). The draw-off side half portion (44b) communicates with the lower end of the on-off valve side half portion (44a) and extends obliquely upward to be open through the surface (42a), which is a portion on the upper surface of the block body (42) projecting from the body portion of the outlet on-off valve (7) toward the line exit side.

The end portion of the draw-off side half portion (44b) is designed to communicate with a channel of an appropriate channel block that enables connection to an external member via a seal portion. The end portion of the draw-off side half portion (44b) may be provided with the same cylindrical connection portion as in the first embodiment. In any case, by virtue of the fluid draw-off block joint (41), the outlet channel (7b) of the outlet on-off valve (7) is connectable to any external member without communicating with the bifurcated channel (12b) of the plural-line block joint (12).

The outlet channel (11b) of the single-line block joint (11) butts against the inlet channel (43) of the fluid draw-off block joint (41) via a seal portion (13). The inlet channel (43) of the fluid draw-off block joint (41) butts against the inlet channel (7a) of the outlet on-off valve (7) via a seal portion (13). The outlet channel (7b) of the outlet on-off valve (7) also butts against the outlet channel (44) of the fluid draw-off block joint (41) via a seal portion (13). The seal portion (13) is formed by providing an annular seal member (15) in an annular recess (14) formed by butting against opposed recesses, provided on both abutted-against surfaces, against each other.

In FIG. 4, although it is preferable that the bifurcated channel (12b) of the plural-line block joint (12) is closed, the plural-line block joint (12) used is the same as that used in the outlet on-off valve support structure (51) as illustrated in FIG. 6. That is, the bifurcated channel (12b) of the plural-line block joint (12) does not correspond to the structure of the fluid draw-off block joint (21), and is not closed. Specifically stated, the bifurcated channel (12b) of the plural-line block joint (12) is designed to be capable of drawing off the fluid that has passed through the outlet channel (7b) of the outlet on-off valve (7). Therefore, in the outlet on-off valve support structure (40) including the fluid draw-off block joint (41), there exists a risk that the fluid may leak out from the upper end of the bifurcated channel (12b) of the plural-line block joint (12). To eliminate the risk, the block body (42) is provided on its lower surface with a closure portion (46) closing the opening of the bifurcated channel (12b) of the plural-line block joint (12).

The closure portion (46) has the same configuration as the seal portion (13). The closure portion (46) is formed by providing an annular seal member (15) in an annular recess (14) as defined by a recess on the lower surface of the block body (42) and a recess on the upper surface of the plural-line block joint (12).

Although not illustrated, the block body (42) is provided with through-bores into which male-threaded members (20) are inserted in order to attach the outlet on-off valve (7) to the single-line block joint (11) and the plural-line block joint (12). The fluid draw-off block joint (41) is upwardly removably mounted on the corresponding single-line block joint (11) and the plural-line block joint (12) as lower stage block joint members, by means of the male-threaded members (20).

The outlet on-off valve support structure (40) illustrated in FIG. 4 may be used for any of the six lines (A), (B), (C), (D), (E), (F) illustrated in FIG. 5.

As described above, in the outlet on-off valve support structure (40), the fluid may be drawn off without passing through the fluid draw-off channel (12a) of the plural-line block joint (12). Therefore, the use of this outlet on-off valve support structure (40) in combination with the conventional outlet on-off valve support structure (51) enables not only the drawing off of the fluid from the fluid draw-off portion (9), which is a function the conventional fluid control apparatus has, but also the separate drawing off of the fluid from the optional line only. This configuration improves flexibility of the fluid drawing-off from a plurality of lines.

In the case where the above-mentioned fluid draw-off block joint (41) is used in the existing fluid control apparatus, only the outlet on-off valve (7) is once removed upwardly from the existing fluid control apparatus for additional attachment of the fluid draw-off block joint (41). All the parts and components used in the existing fluid control apparatus may be used except for the male-threaded members. The male-threaded member used in the existing fluid control apparatus is replaced by the male-threaded member (20) having a length greater than the existing one so as to correspond to the combined length of the fluid draw-off block joint (41) and the once-removed outlet on-off valve (7). Thus, the fluid draw-off block joint (41) and the outlet on-off valve (7) are attached to the corresponding single-line block joint (11) and the plural-line block joint (12) by means of the male-threaded members (20). With this configuration, there is no need for changing the plural-line block joint (12), a change or a replacement of which is troublesome because it is disposed over all the lines, whereby the fluid control apparatus that enables the individual drawing-off of the fluid from any of the lines is obtained.

What is claimed is:

1. A fluid control apparatus joint,
the fluid control apparatus including a plurality of lines arranged in parallel, with inlets of all the lines being oriented in a same direction and outlets of all the lines being oriented in a same direction, each of the lines having a plurality of fluid control devices arranged on an upper stage and a plurality of joint members arranged on a lower stage,
each of the lines including an outlet on-off valve as one of the fluid control devices, and a single-line block joint and an plural-line block joint both as the joint members supporting the outlet on-off valve,
the outlet on-off valve having an inlet channel and an outlet channel both being open through a lower surface of the outlet on-off valve,
the single-line block joint having an inlet channel and an outlet channel both being open through an upper surface of the single-line block joint, and each of the single-line block joints being provided for each line,
the plural-line block joint, in the fluid control apparatus as a whole, having: a fluid draw-off channel extending in a direction orthogonal to the lines; and a plurality of bifurcated channels being open through an upper surface of the plural-line block joint, and the plural-line block joint being common to the plurality of lines,
the fluid control apparatus joint,
being block-shaped, and
being disposed such that an upper surface of the fluid control apparatus joint butts against the lower surface of the outlet on-off valve, and a lower surface of the fluid control apparatus joint contacts the upper surface of the single-line block joint and the upper surface of the plural-line block joint,
the fluid control apparatus joint including:
an inlet channel having a first end being open through the lower surface of the fluid control apparatus joint and communicating with the outlet channel of the single-line block joint, and a second end being open through the upper surface of the fluid control apparatus joint and communicating with the inlet channel of the outlet on-off valve;
an outlet channel having a first end being open through the upper surface of the fluid control apparatus joint and communicating with the outlet channel of the outlet on-off valve, and a second end being open in a line exit direction; and
a closure portion closing an opening of the bifurcated channel of the plural-line block joint.

2. The fluid control apparatus joint according to claim 1, wherein the outlet channel of the fluid control apparatus joint has a first end that is open through the upper surface of the fluid control apparatus joint and communicates with the outlet channel of the outlet on-off valve, and a second end that is open through a side surface of the fluid control apparatus joint.

3. The fluid control apparatus joint according to claim 1, wherein the outlet channel of the fluid control apparatus joint has a first end that is open through the upper surface of the fluid control apparatus joint and communicates with the outlet channel of the outlet on-off valve, and a second end that is open through the upper surface of the fluid control apparatus joint, with the first end being flush with the second end.

4. A fluid control apparatus including a plurality of lines arranged in parallel, with inlets of all the lines being oriented in a same direction and outlets of all the lines being oriented in a same direction, each of the lines having a plurality of fluid control devices arranged on an upper stage and a plurality of joint members arranged on a lower stage,     each of the lines including an outlet on-off valve as one of the fluid control devices, and a single-line block joint and an plural-line block joint both as the joint members supporting the outlet on-off valve,     the outlet on-off valve having an inlet channel and an outlet channel both being open through a lower surface of the outlet on-off valve,     the single-line block joint having an inlet channel and an outlet channel both being open through an upper surface of the single-line block joint, and each of the single-line block joints being provided for each line,     the plural-line block joint, in the fluid control apparatus as a whole, having: a fluid draw-off channel extending in a direction orthogonal to the lines; and a plurality of bifurcated channels being open through an upper surface of the plural-line block joint, and the plural-line block joint being common to the plurality of lines,     the fluid control apparatus further including a fluid control apparatus joint being block-shaped, and being disposed such that an upper surface of the fluid control apparatus joint butts against the lower surface of the outlet on-off valve, and a lower surface of the fluid control apparatus joint contacts the upper surface of the single-line block joint and the upper surface of the plural-line block joint,     the fluid control apparatus joint including:

an inlet channel having a first end being open through the lower surface of the fluid control apparatus joint and communicating with the outlet channel of the single-line block joint, and a second end being open through the upper surface of the fluid control apparatus joint and communicating with the inlet channel of the outlet on-off valve;

an outlet channel having a first end being open through the upper surface of the fluid control apparatus joint and communicating with the outlet channel of the outlet on-off valve, and a second end being open in a line exit direction; and         a closure portion closing an opening of the bifurcated channel of the plural-line block joint.

5. The fluid control apparatus according to claim 4, wherein the outlet channel of the fluid control apparatus joint has a first end that is open through the upper surface of the fluid control apparatus joint and communicates with the outlet channel of the outlet on-off valve, and a second end that is open through a side surface of the fluid control apparatus joint.

6. The fluid control apparatus according to claim 4, wherein the outlet channel of the fluid control apparatus joint has a first end that is open through the upper surface of the fluid control apparatus joint and communicates with the outlet channel of the outlet on-off valve, and a second end that is open through the upper surface of the fluid control apparatus joint, with the first end being flush with the second end.

\* \* \* \* \*